United States Patent
Cheskis

(10) Patent No.: US 10,439,360 B1
(45) Date of Patent: Oct. 8, 2019

(54) VCSEL WITH EMISSION ON SUBSTRATE SIDE

(71) Applicant: II-VI OptoElectronic Devices, Inc., Warren, NJ (US)

(72) Inventor: David Cheskis, Belle Mead, NJ (US)

(73) Assignee: II-VI Delaware, Inc., Wilmington, DE (US)

( * ) Notice: Subject to any disclaimer, the term of this patent is extended or adjusted under 35 U.S.C. 154(b) by 309 days.

(21) Appl. No.: 14/957,981

(22) Filed: Dec. 3, 2015

Related U.S. Application Data

(60) Provisional application No. 62/087,690, filed on Dec. 4, 2014.

(51) Int. Cl.
| | |
|---|---|
| H01S 3/06 | (2006.01) |
| H01S 3/08 | (2006.01) |
| H01S 5/187 | (2006.01) |
| H01S 5/323 | (2006.01) |
| H01S 5/183 | (2006.01) |
| H01S 3/067 | (2006.01) |
| H01S 5/02 | (2006.01) |

(52) U.S. Cl.
CPC ............ H01S 5/187 (2013.01); H01S 3/0623 (2013.01); H01S 3/0675 (2013.01); H01S 3/0805 (2013.01); H01S 5/183 (2013.01); H01S 5/18305 (2013.01); H01S 5/32316 (2013.01); *H01S 5/0207* (2013.01)

(58) Field of Classification Search
CPC .... H01S 5/187; H01S 3/0675; H01S 5/18305; H01S 3/0805; H01S 3/0623; H01S 5/32316; H01S 5/183; H01S 5/0207
See application file for complete search history.

(56) References Cited

U.S. PATENT DOCUMENTS

| | | | | |
|---|---|---|---|---|
| 5,701,321 A | * | 12/1997 | Hayafuji | ............... H01L 27/156 372/44.011 |
| 2003/0007528 A1 | * | 1/2003 | Uchiyama | ........... H01S 5/18313 372/46.013 |

(Continued)

FOREIGN PATENT DOCUMENTS

| | | | | | |
|---|---|---|---|---|---|
| CN | 101931163 A | * | 12/2010 | ............. | H01S 5/183 |
| CN | 101931163 A | * | 12/2010 | ............. | H01S 5/183 |

*Primary Examiner* — Yuanda Zhang
(74) *Attorney, Agent, or Firm* — Wendy W. Koba

(57) ABSTRACT

A VCSEL is described that provides for emission from the substrate side. The VCSEL comprises a substrate having first and second major surfaces, a first distributed Bragg reflector (DBR) on the first major surface of the substrate, an active region on the first DBR, and a second DBR on the active region. These elements are aligned on a longitudinal axis along which laser radiation is emitted. In an illustrative embodiment of the invention, an open region extends through the substrate along the longitudinal axis between the second major surface of the substrate and the first DBR. An anti-reflection coating and a first ohmic contact are located on the first DBR in this region. Preferably the first ohmic contact extends around all or part of the anti-reflection coating. A second ohmic contact is located on the surface of the second DBR. The two DBRs form a laser cavity; and emission takes place along the longitudinal axis through the anti-reflection coating. A method for forming the VCSEL is also described.

21 Claims, 2 Drawing Sheets

(56) References Cited

U.S. PATENT DOCUMENTS

| | | | |
|---|---|---|---|
| 2005/0243890 A1* | 11/2005 | Kim | B82Y 20/00 372/99 |
| 2005/0271113 A1* | 12/2005 | Song | H01S 5/02461 372/98 |
| 2007/0165689 A1* | 7/2007 | Lee | H01S 5/18383 372/99 |
| 2009/0041077 A1* | 2/2009 | Andersen | G11B 7/125 372/50.124 |
| 2011/0188531 A1* | 8/2011 | Gerlach | H01S 5/18391 372/50.11 |

* cited by examiner

VCSEL WITH EMISSION ON SUBSTRATE SIDE

CROSS REFERENCE TO RELATED APPLICATION

This application claims benefit of provisional application Ser. No. 62/087,690, filed Dec. 4, 2014, which application is incorporated by reference herein in its entirety.

BACKGROUND

This relates to a vertical cavity surface emitting laser (VCSEL). A conventional VCSEL comprises a substrate having first and second major surfaces, a first distributed Bragg reflector (DBR) on the first major surface of the substrate, an active region on the first DBR, and a second DBR on the active region. The two DBRs form a laser cavity; and when an appropriate current is supplied to the VCSEL, laser emission takes place along the longitudinal axis of the VCSEL.

SUMMARY

Ordinarily, a VCSEL is designed to emit laser emission from the second DBR. The present invention provides for laser emission from the first DBR on the substrate side of the VCSEL. In an illustrative embodiment of the invention, an open region extends through the substrate along the longitudinal axis of the VCSEL between the outer surface of the substrate and the first DBR. An anti-reflection coating and a first ohmic contact are located on the first DBR in this region. Preferably the first ohmic contact extends around all or part of the periphery of the anti-reflection coating. A second ohmic contact is located on the surface of the second DBR. When a current is established between the ohmic contacts, laser emission takes place along the longitudinal axis through the anti-reflection coating.

Illustratively, the VCSEL is formed by forming the first DBR on a first major surface of a substrate, forming an active region on the first DBR, forming a second DBR on the active region, and forming a second ohmic contact on the second DBR. The second ohmic contact, the second DBR and the active region are then mesa etched to remove unwanted material and leave the second ohmic contact, second DBR and active region aligned along a longitudinal axis of the VCSEL. A portion of the substrate extending between the first and second major surfaces along the longitudinal axis is then removed to expose a portion of the first DBR. A first ohmic contact is formed on the exposed portion of the first DBR; and part of the first ohmic contact around the longitudinal axis is then removed and replaced with an anti-reflection coating.

By removing the substrate at the point where radiation is emitted from the VCSEL, it is possible to operate the VCSEL at a wavelength below the nominal cutoff of GaAs (approximately 890 nanometers (nm.)) or InP (approximately 1550 nm.). In particular, it is possible to operate the VCSEL at 850 or 1550 nm. where systems are optimized and well understood and complementary components are readily available. And by connecting the first ohmic contact to the first DBR instead of to the substrate, an electric circuit is made that does not include the relatively high resistance of the substrate.

BRIEF DESCRIPTION OF DRAWING

These and other objects, features and advantages of the invention will be more readily apparent from the following detailed description in which.

DETAILED DESCRIPTION

Figure 1:
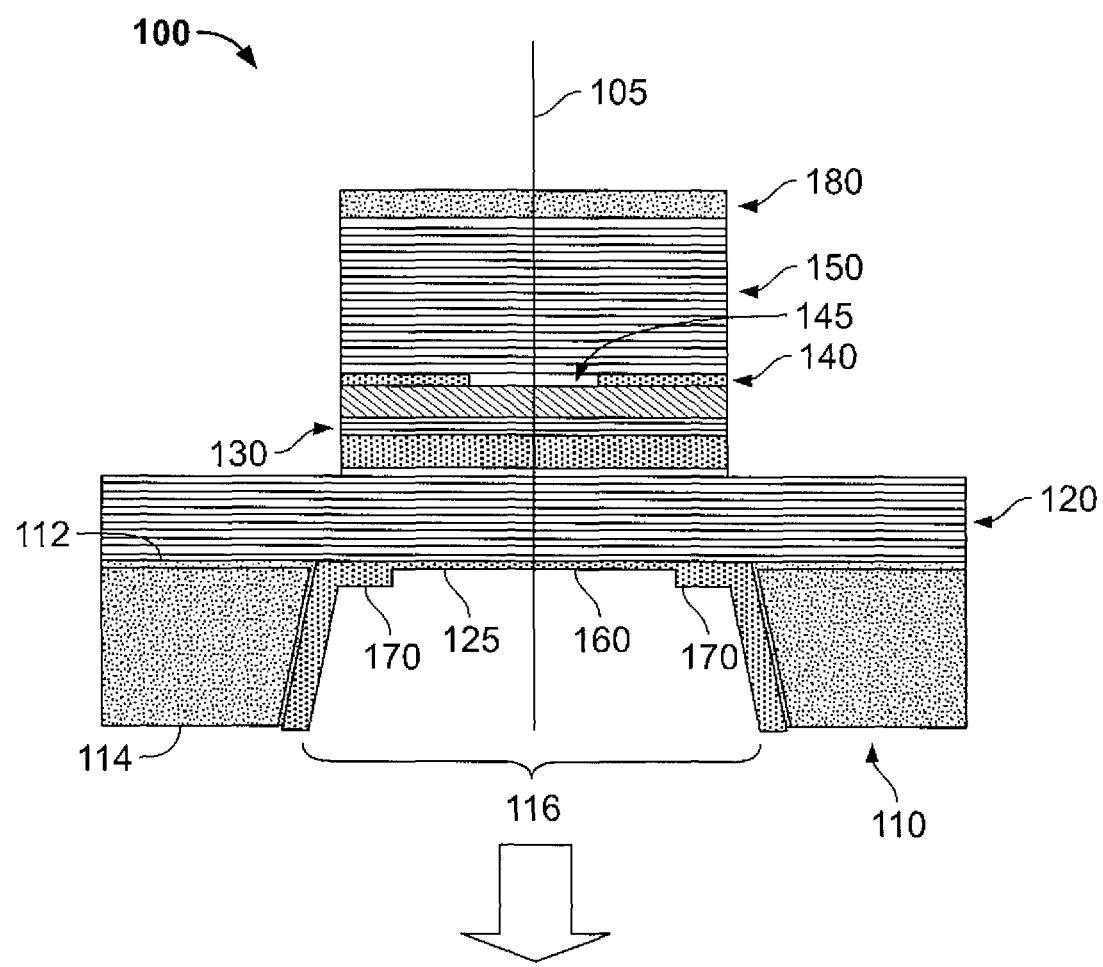
FIG. 1 is a cross-section of an illustrative embodiment of the present invention.

FIG. 1 depicts an illustrative embodiment of a vertical cavity surface emitting laser (VCSEL) 100 of the invention. VCSEL 100 comprises a substrate 110 having first and second major surfaces 112, 114, a first distributed Bragg reflector (DBR) 120 on the first major surface of the substrate, an active region 130 on the first DBR, and a second DBR 150 on the active region. These elements are aligned on a longitudinal axis 105 along which laser radiation is emitted. Illustratively, these elements are shaped in a so-called mesa or air-post configuration with the lateral dimensions of the active region, second DBR and second ohmic contact being appreciably smaller than the lateral dimensions of the first DBR and substrate. Typically, an aperture layer 140 is formed between active region 130 and second DBR 150 to confine current flow to a central region 145 along the longitudinal axis of the VCSEL.

The substrate has an open region 116 that extends between the first and second major surfaces 112, 114 of the substrate along longitudinal axis 105. An anti-reflection coating 160 and a first ohmic contact 170 are located on an exposed portion 126 of the first DBR 120 in region 116. Preferably anti-reflection coating 160 is continuous, approximately circular is shape, and centered on axis 105; and first ohmic contact 170 is adjacent the anti-reflection coating and extends around all or part of the periphery of the coating. A second ohmic contact 180 is located on the upper surface of the second DBR 150. Typically, substrate 110, first DBR 120 and first ohmic contact 170 are one type of conductivity, illustratively n-type; and second DBR 150 and second ohmic contact 180 are the opposite type, illustratively p-type.

Each DBR is a set of alternating layers of two semiconductor materials having different indices of refraction with each layer having a thickness of one quarter the operating wavelength of the VCSEL. Optical interference between the radiation reflected at the interface between successive layers makes each DBR a highly effective reflector. DBRs 120 and 150 form a laser cavity; and when a suitable current is established between contact 170 and 180, laser emission takes place along axis 105 through anti-reflection coating 160.

Figure 2:
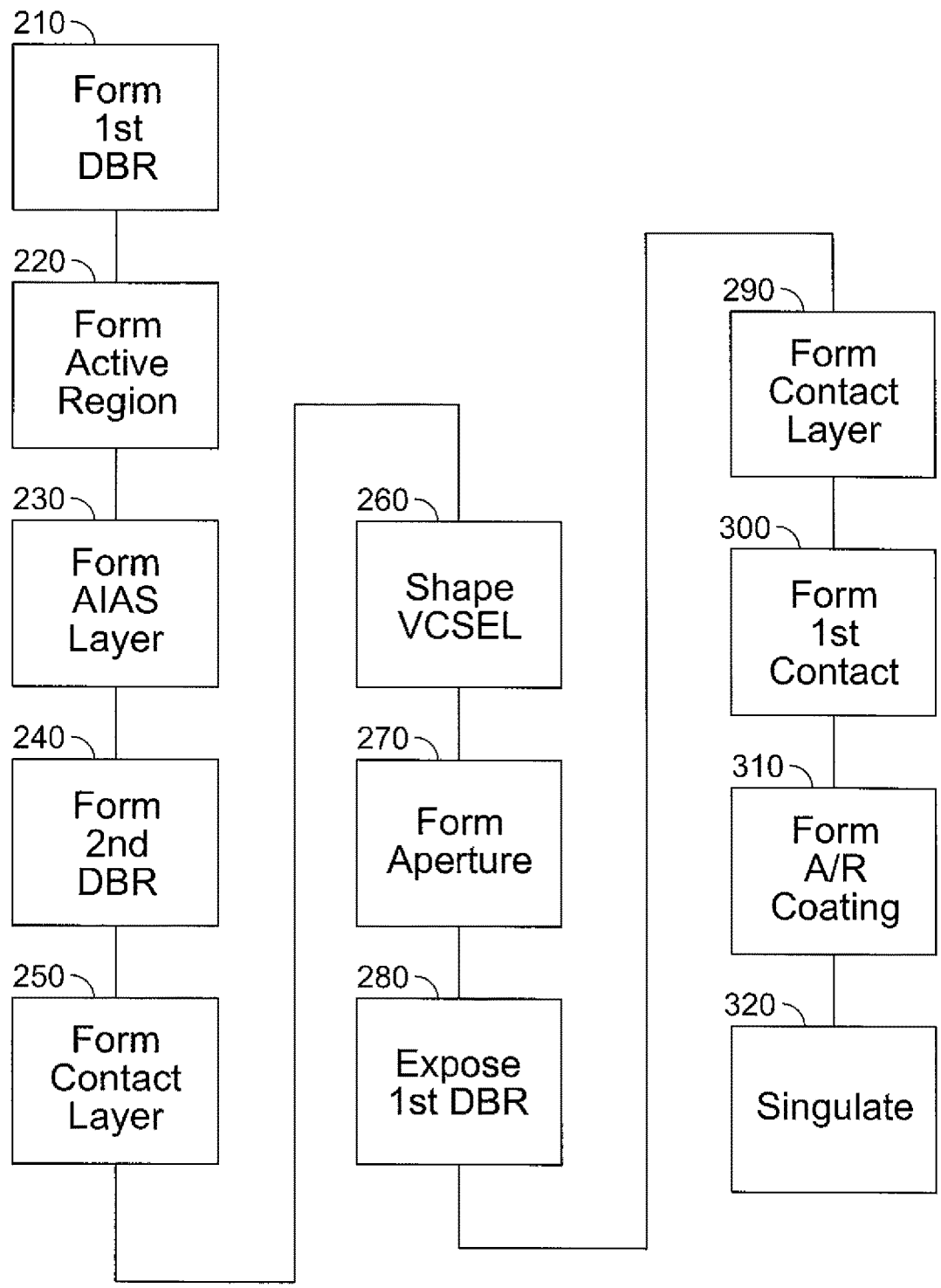
FIG. 2 is a flow chart depicting an illustrative embodiment of a method for making the embodiment of FIG. 1.

FIG. 2 depicts an illustrative embodiment of a method for making the VCSEL of FIG. 1. The starting point for this method is a wafer of a semiconductor material such as n-type GaAs. that may be up to 6 inches (150 mm.) in diameter and about 675 micrometers (um.) thick in today's state-of-the-art processes. Typically, numerous identical devices are formed simultaneously in the wafer, each of which devices includes one or more VCSELs of the type described herein. After processing of the wafer is completed, the wafer is broken apart into the individual devices. As will be apparent, a portion of the wafer serves as the substrate of each device.

The process begins at step 210 by forming a first distributed Bragg reflector on a first major surface of the substrate. Illustratively, the DBR is formed by epitaxially growing alternating layers of first and second materials having different refractive indices where the thickness of each layer is one quarter the wavelength of the radiation emitted by the VCSEL. In the case of a GaAs VCSEL, the layers of first and second materials are layers of n-type AlGaAs and GaAs.

At step 220, an active region is formed on the first DBR. Illustratively, the active region comprises several thin layers about 10 nm. thick of quantum wells with upper and lower cladding layers.

At step 230 in some processes, a layer of AlAs or AlGaAs is formed on the upper cladding layer. This layer is subsequently oxidized to form an oxide aperture.

At step 240, a second DBR is formed above the active region typically using the same materials and same processes used in forming the first DBR. However, the number of layers in the second DBR may be, and typically is, different from the number in the first DB; and the layers have opposite conductivity type.

At step 250, a layer of contact metal is formed on the surface of the second DBR to make an ohmic contact with the second DBR.

At step 260 portions of the layers of contact metal, layers of the second DBR and layers of the active region are removed to form the final mesa shape of the VCSEL. Typically, the patterning of the contact metal, the second DBR and the active region is performed using one or more conventional photolithographic processes.

If an aperture is to be formed, this is done at step 270. For example, an oxide aperture may be formed in an AlAs or AlGaAs layer between the active region and the second DBR by exposing that layer to a hot water vapor atmosphere. Alternatively, an aperture may be formed by ion implantation.

At step 280, the substrate is thinned; and a portion of the substrate along the longitudinal axis is removed to expose a portion of the first DBR. Preferably, the thinning is done using conventional wafer thinning processes. The remaining portion that is removed is done using a photolithographic process to define the region of the substrate that is to be removed and then etching the substrate away in that region to form a hole through which a portion of the first DBR is exposed.

The sidewalls of the hole are then coated with an insulating material and portions of this material are then removed to expose a portion of the first DBR along the longitudinal axis.

At step 290, a layer of contact metal is formed on the exposed surfaces of the substrate and the first DBR to make an ohmic contact with the first DBR. This layer is then shaped at step 300 by conventional photolithographic processes to shape the first ohmic contact and to remove the contact metal from a portion of the first DBR centered on the longitudinal axis.

At step 310, an anti-reflection coating is formed on the exposed portion of the first DBR. Illustratively, the shape of the contact metal that is removed is approximately circular so that the shape of the anti-reflection coating on the first DBR is also approximately circular.

The wafer is then singulated at step 320 to separate the individual VCSELs.

As will be apparent to those skilled in the art, numerous variations may be practiced within the spirit and scope of the present invention. For example, there are various alternative processes for the formation of the DBRs and active region such as metal-organic chemical vapor deposition (MOCVD) and molecular beam epitaxy (MBE) and various alternatives such as ion implantation and oxide apertures for confining current flow in the VCSEL. The order of some of the steps performed may be varied from the order in which they are performed herein. In addition to GaAs material systems, a variety of other material systems are available for use in practicing the invention including systems using InP, GaAs/InGaP, GaSb, GaInNAs(Sb), AlGaInP and GaN. Details of such systems and others may be found in R. Michalzik (ed.), VCSELS Fundamentals, Technology and Applications of Vertical Cavity Surface-Emitting Lasers (Springer, 2013) which is incorporated by reference herein. In the interest of brevity, many of the processing details in the formation of a VCSEL have been omitted but will be familiar to those skilled in the art.

What is claimed is:

1. A vertical cavity surface emitting laser (VCSEL) comprising:
    a substrate;
    a first distributed Bragg reflector (DBR) on a first major surface of the substrate;
    an open region in the substrate that exposes part of a first surface of the first DBR;
    an anti-reflection coating on a first portion of the exposed first surface of the first DBR;
    a first electrical contact on a second portion of the exposed first surface of the first DBR;
    an active region on a second surface of the first DBR;
    a second DBR adjacent the active region; and
    a second electrical contact on the second DBR.

2. The VCSEL of claim 1 wherein the first electrical contact and the first DBR are a first conductivity type and the second electrical contact and the second DBR are a second conductivity type, opposite the first conductivity type.

3. The VCSEL of claim 1 wherein the substrate is n-type GaAs.

4. The VCSEL of claim 3 wherein the first and second DBRs comprise alternating first and second layers of AlGaAs and GaAs and the layers are approximately one quarter wavelength in thickness at the operating wavelength of the VCSEL.

5. The VCSEL of claim 1 further comprising an oxide aperture aligned with the anti-reflection coating for confining current flow in the VCSEL.

6. The VCSEL of claim 1 further comprising an aperture layer disposed between the active region and the second DBR, the aperture layer having an aperture therein for confining current flow along a longitudinal axis of the VCSEL.

7. The VCSEL of claim 1 further comprising an annular implanted region in the second DBR that is aligned with the anti-reflection coating.

8. The VCSEL of claim 1 wherein the first electrical contact substantially surrounds the periphery of the anti-reflection coating on the first DBR.

9. A vertical cavity surface emitting laser (VCSEL) comprising:
    an active region having first and second major surfaces;
    a first distributed Bragg reflector (DBR) on the first major surface of the active region;
    an anti-reflection coating on a first portion of an exposed surface of the first DBR;
    a first electrical contact on a second portion of the exposed surface of the first DBR, and substantially surrounding a periphery of the antireflection coating on the first DBR;
    a substrate on the first DBR, wherein the substrate has an open region within which the first electrical contact and the anti-reflection coating are located;
    an aperture layer on the second major surface of the active region having an aperture aligned with the anti-reflection coating;

a second DBR on the aperture layer; and a second electrical contact on the second DBR.

10. The VCSEL of claim 9 wherein the first electrical contact and the first DBR are a first conductivity type and the second electrical contact and the second DBR are a second conductivity type, opposite the first conductivity type.

11. The VCSEL of claim 9 wherein the substrate is n-type GaAs.

12. The VCSEL of claim 11 wherein the first and second DBRs comprise alternating first and second layers of AlGaAs and GaAs and the layers are approximately one quarter wavelength in thickness at the operating wavelength of the VCSEL.

13. A vertical cavity surface emitting laser (VCSEL) comprising:

an active region having first and second major surfaces;

a first distributed Bragg reflector (DBR) on the first major surface of the active region;

an anti-reflection coating on a first portion of an exposed surface of the first DBR;

a first ohmic contact on a second portion of the exposed surface of the first DBR;

a second DBR on the second major surface of the active region; and a second ohmic contact on the second DBR.

14. The VCSEL of claim 13 wherein the first ohmic contact and the first DBR are a first conductivity type and the second ohmic contact and the second DBR are a second conductivity type, opposite the first conductivity type.

15. The VCSEL of claim 13 further comprising an aperture layer disposed between the active region and the second DBR, the aperture layer having an aperture therein for confining current flow along a longitudinal axis of the VCSEL.

16. A method for fabricating a vertical cavity surface emitting laser comprising:

forming a first distributed Bragg reflector (DBR) on a first major surface of a substrate;

forming an active region on the first DBR;

forming a second DBR on the active region;

removing a portion of the substrate to expose a portion of the first DBR;

forming a first electrical contact on a first part of an exposed surface of the first DBR;

forming an anti-reflection coating on a second part of the exposed portion of the first DBR; and forming a second electrical contact on the second DBR.

17. The method of claim 16 further comprising forming an aperture layer between the active region and the second DBR; and forming an aperture in the aperture layer, the aperture for confining current flow along a longitudinal axis of the VCSEL.

18. The method of claim 16 further comprising implanting an annular region in the second DBR that is aligned with the anti-reflection coating.

19. The VCSEL of claim 9 wherein the open region forms sidewalls in the substrate and the first electrical contact extends along at least a portion of the sidewalls.

20. The VCSEL of claim 9 wherein the aperture confines current flow along a longitudinal axis of the VCSEL.

21. The method of claim 17 wherein the aperture is formed by oxidation or ion implantation.

\* \* \* \* \*